(12) United States Patent
Iwakura et al.

(10) Patent No.: US 10,121,941 B2
(45) Date of Patent: Nov. 6, 2018

(54) LIGHT SOURCE DEVICE

(71) Applicant: NICHIA CORPORATION, Anan-shi, Tokushima (JP)

(72) Inventors: Daisuke Iwakura, Komatsushima (JP); Masaki Hayashi, Anan (JP); Shoji Hosokawa, Tokushima (JP); Yusaku Achi, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/277,498

(22) Filed: Sep. 27, 2016

(65) Prior Publication Data

US 2017/0090095 A1   Mar. 30, 2017

(30) Foreign Application Priority Data

Sep. 30, 2015   (JP) ................. 2015-193456

(51) Int. Cl.
| | |
|---|---|
| *H01L 33/50* | (2010.01) |
| *H01L 33/44* | (2010.01) |
| *H01L 33/52* | (2010.01) |
| *F21V 8/00* | (2006.01) |
| *G02F 1/1335* | (2006.01) |

(52) U.S. Cl.
CPC .............. *H01L 33/50* (2013.01); *H01L 33/44* (2013.01); *G02B 6/0031* (2013.01); *G02B 6/0073* (2013.01); *G02F 1/133603* (2013.01); *H01L 33/52* (2013.01)

(58) Field of Classification Search
CPC ......... H01L 33/50; H01L 33/44; H01L 33/52; G02B 6/0031; G02B 6/0073; G02F 1/133603
See application file for complete search history.

(56) References Cited

U.S. PATENT DOCUMENTS

| | | | |
|---|---|---|---|
| 2004/0119086 A1 | 6/2004 | Yano et al. | |
| 2004/0124430 A1 | 7/2004 | Yano et al. | |
| 2005/0253130 A1 | 11/2005 | Tsutsumi et al. | |
| 2006/0255716 A1* | 11/2006 | Tsutsumi | B82Y 30/00 |
| | | | 313/502 |

(Continued)

FOREIGN PATENT DOCUMENTS

| | | |
|---|---|---|
| JP | 2004-193580 A | 7/2004 |
| JP | 2004-193581 A | 7/2004 |

(Continued)

*Primary Examiner* — Kevin Quarterman
(74) *Attorney, Agent, or Firm* — Hunton Andrews Kurth LLP (57) ABSTRACT

A light source device having: a blue light emitting element that emits blue light having an emission peak in a wavelength region of 440 nm to 460 nm; a green phosphor that absorbs part of the blue light emitted by the blue light emitting element and thereby emits green light having an emission peak in a wavelength region of 500 nm to 575 nm; a red phosphor that absorbs at least one of part of the blue light emitted by the blue light emitting element and part of the green light emitted by the green phosphor, and thereby emits red light having an emission peak in a wavelength region of 600 nm to 690 nm; and an absorbent containing neodymium fluoride that absorbs part of the green light and part of the red light.

17 Claims, 8 Drawing Sheets

(56) References Cited

U.S. PATENT DOCUMENTS

| | | | |
|---|---|---|---|
| 2012/0155061 A1 | 6/2012 | Manabe et al. | |
| 2012/0300432 A1 | 11/2012 | Matsubayashi et al. | |
| 2016/0079484 A1 | 3/2016 | Hosokawa et al. | |
| 2016/0097496 A1* | 4/2016 | Allen | F21V 3/0481 257/40 |
| 2016/0097497 A1* | 4/2016 | Benner | F21V 3/0481 313/503 |
| 2016/0356435 A1* | 12/2016 | Dudik | H05B 33/14 |

FOREIGN PATENT DOCUMENTS

| | | |
|---|---|---|
| JP | 2005-310756 A | 11/2005 |
| JP | 2006-319238 A | 11/2006 |
| JP | 2012-199288 A | 10/2012 |
| JP | 2013-505347 A | 2/2013 |
| JP | 2014-075186 A | 4/2014 |
| WO | 2011-036447 A1 | 3/2011 |
| WO | 2011-108203 A1 | 9/2011 |
| WO | 2011-142127 A1 | 11/2011 |
| WO | 2014-076948 A1 | 5/2014 |
| WO | WO 2016054764 A1 * 4/2016 ............... G02B 1/04 |  |

\* cited by examiner

LIGHT SOURCE DEVICE

CROSS-REFERENCE TO RELATED APPLICATION

This application claims priority to Japanese Patent Application No. 2015-193456, filed on Sep. 30, 2015, the entire disclosure of which is hereby incorporated by reference.

BACKGROUND

1. Technical Field

The present disclosure relates to a light source device.

2. Description of Related Art

A transmissive liquid crystal display device generates perceivable images using light emission from a backlight light source provided in a back surface of a liquid crystal panel. There has been proposed a backlight device (backlight light source) having a blue light emitting element, a green phosphor, a red phosphor, and a filter material that attenuates the light in the wavelength region of 570 nm to 590 nm. As such a filter material, neodymium oxide and neodymium glass have been proposed (see, for example, Japanese Unexamined Patent Application Publication No. 2012-199288).

In a white light source using a blue light emitting element, a green phosphor, and a red phosphor, there is only a small overlap of emission spectra of the blue light emitting element and the green phosphor, but there is a large overlap of emission spectra of the green phosphor and the red phosphor at a particular wavelength region, which substantially corresponds to yellow light. As a result, a light source using both a green phosphor and a red phosphor tends to have an emission spectrum having a high intensity in the yellow wavelength region.

With regard to color filters provided on a liquid crystal panel, there is also an overlap of transmission spectra of a green filter and a red filter at the above described particular wavelength region. As a result, when a green color is represented by the liquid crystal panel, the light transmitted through a green filter includes pure green light and yellow light. Similarly, the light transmitted through a red filter includes pure red light and yellow light.

The backlight light source disclosed in Japanese Unexamined Patent Application Publication No. 2012-199288 includes filter material that attenuates the light in the wavelength region of 570 nm to 590 nm, which corresponds to the above described particular wavelength region, so that the backlight light source has an emission spectrum having a low intensity in the yellow wavelength region.

SUMMARY OF THE INVENTION

A light source device according to an embodiment of the present disclosure has: a blue light emitting element that emits blue light having an emission peak in the wavelength region of 440 nm to 460 nm; a green phosphor that absorbs part of blue light emitted by the blue light emitting element and thereby emits green light having an emission peak in the wavelength region of 500 nm to 575 nm; a red phosphor that absorbs at least one of part of the blue light emitted by the blue light emitting element and part of the green light emitted by the green phosphor, and thereby emits red light having an emission peak in the wavelength region of 600 nm to 690 nm; and an absorbent containing neodymium fluoride that absorbs part of the green light and part of the red light.

The light source device according to the present disclosure provides, when used as a white light source that is color-separated into RGB by color filters to use the resulted colors as three primary colors, a wide color reproduction range and a low optical loss.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE PREFERRED EMBODIMENTS

The embodiments will now be described with reference to the accompanying drawings, wherein like reference numerals designate corresponding or identical elements throughout the various drawings.

Hereinafter, a description will be given of light source devices according to the present embodiments.

Drawings referenced in the following description schematically shows embodiments. Thus, scales of members, distances between members, and positional relation between members or the like may have been presented in an exaggerated manner, and illustration of a part of a member may have been omitted. In addition, scales of members and/or distances between members may not be the same across cross sections, for example. In the following description, members that are the same or analogous will be given the same name or number in principle, and duplicative detailed descriptions will be appropriately omitted.

It is to be noted that, in a light source device according to an embodiment of the invention, interpretation of directions like "up", "down", "left", and "right" should be changed according to the situation. It is to be noted that, directions like "up" and "down" are used to represent relative positions between constituent elements in a drawing referenced for explanation and are not intended to specify the absolute positions unless otherwise stated.

A light source device according to embodiments of the invention includes a blue light emitting element, a green phosphor, a red phosphor, and an absorbent. The absorbent is contained in a member located on a light path through which the blue light emitting element, the green phosphor, and the red phosphor emit light. Hereinafter, first to fourth embodiments, which have differences in the light source device's member containing the absorbent, will be specifically described.

First Embodiment

Figure 1:
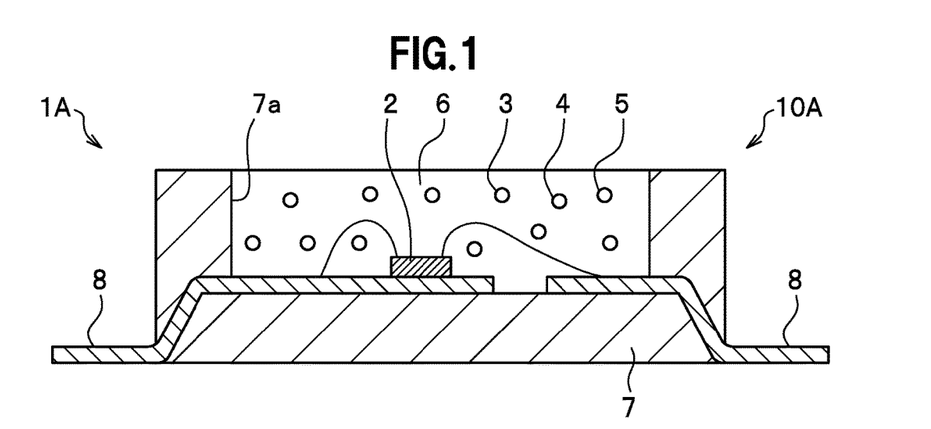
FIG. 1 is a cross section showing the structure of a light source device according to a first embodiment.
Figure 2:
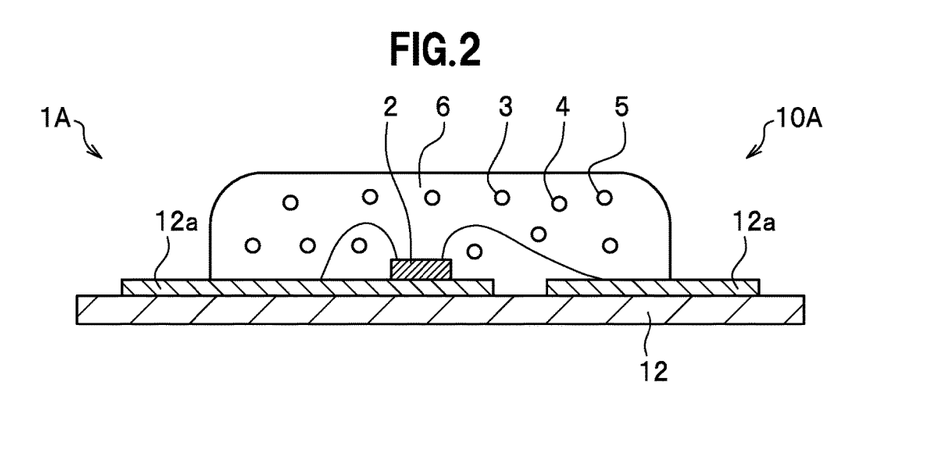
FIG. 2 is a cross section showing another embodiment of the light source device shown in FIG. 1.

A light source device according to a first embodiment will be described with reference to FIGS. 1 and 2. FIG. 1 is a cross section showing the structure of a light source device according to the first embodiment. FIG. 2 is a cross section showing another embodiment of the light source device shown in FIG. 1.

As shown in FIG. 1, a light source device 1A according to the first embodiment has a blue light emitting element 2, a green phosphor 3, a red phosphor 4, an absorbent 5, and a first light-transmissive member 6. The first light-transmissive member 6 contains the absorbent 5.

In the light source device 1A, the first light-transmissive member 6 contains the absorbent 5. This allows the light obtained using the light source device 1A to have a wide color reproduction range, and does not cause a significant decrease in the brightness of the light. As a result, the light source device 1A is preferably used as a backlight light source of a liquid crystal display device, for example.

Hereinafter, a description will be given of the light source device 1A with respect to the components thereof.

Blue Light Emitting Element

The blue light emitting element 2 is a light emitting element that emits blue light having an emission peak in the wavelength region of 440 nm to 460 nm. A preferable example of such a blue light emitting element 2 is one having a semiconductor light emitting portion in which a light emitting layer is disposed between an n-type semiconductor layer and a p-type semiconductor layer. Preferably, the semiconductor light emitting portion is, for example, formed of a gallium nitride based semiconductor material represented by the general formula $In_xAl_yGa_{1-x-y}N$ ($0 \leq x$, $0 \leq y$, and $x+y \leq 1$).

Green Phosphor

The green phosphor 3 is a phosphor that absorbs part of the blue light emitted by the blue light emitting element 2, thereby emitting green light having an emission peak in the wavelength region of 500 nm to 575 nm, preferably 520 nm to 550 nm. Due to the green phosphor 3 having an emission peak in the above descried wavelength region, emission spectra of the green phosphor 3 and the red phosphor 4 have less overlap in a particular wavelength region, so that the light source device 1A has an emission spectrum having a low intensity in the particular wavelength region (yellow wavelength region). As a result, when the light source device 1A serving as a white light source is color-separated by color filters to use the resulted colors as three primary colors, e.g., when the light source device 1A is used as a backlight light source of a liquid crystal display device, the amount of the yellow light mixed into the light transmitted through the red filter and the light transmitted through the green filter is reduced and thus a wider color reproduction range is obtained.

Preferably, the green phosphor 3 is a phosphor containing at least one selected from the group consisting of a sulfide phosphor, an oxinitride phosphor, and an oxide phosphor. Examples of preferable sulfide phosphors include $SrGa_2S_4$:$Eu^{2+}$; examples of preferable oxinitride phosphors include β-SiAlON:$Eu^{2+}$; and examples of preferable oxide phosphors include $(Ba,Sr)_2SiO_4$:$Eu^{2+}$.

Prior to transmission of the light through color filters, when the emission intensity (spectral intensity) at the emission peak of the blue light emitting element 2 is taken as 1, it is preferable that the emission intensity at the emission peak of the green phosphor 3 be 0.15 to 0.5, more preferably 0.3 to 0.5. In other words, when the spectral intensity at the emission peak of the blue light in the wavelength region of 440 nm to 460 nm is taken as 1, it is preferable that the spectral intensity at the emission peak of the green light in the wavelength region of 500 nm to 575 nm be 0.15 to 0.5, more preferably 0.3 to 0.5. Due to the green phosphor 3 having the above described emission intensity, the light source device 1A has an emission spectrum having an increased intensity in the green wavelength region. This results in an increase in brightness when using the light source device 1A.

Red Phosphor

The red phosphor 4 is a phosphor that absorbs at least one of part of the blue light emitted by the blue light emitting element 2 and part of the green light emitted by the green phosphor 3, thereby emitting red light having an emission peak in the wavelength region of 600 nm to 690 nm, preferably 620 nm to 670 nm. Due to the red phosphor 4 having an emission peak in the above described wavelength region, emission spectra of the red phosphor 4 and the green phosphor 3 have less overlap in a particular wavelength region, so that the light source device 1A has an emission spectrum having a low intensity in the particular wavelength region (yellow wavelength region). As a result, when the light from the light source device 1A serving as a white light source is color-separated by color filters to use the resulted colors as three primary colors, e.g., when the light source device 1A is used as a backlight light source of a liquid crystal display device, the amount of the yellow light mixed into the light transmitted through the red filter and the light transmitted through the green filter is reduced and thus a wider color reproduction range is obtained.

Preferably, the red phosphor 4 is a phosphor containing at least one selected from the group consisting of a fluoride phosphor, a nitride phosphor, an oxinitride phosphor, and a sulfide phosphor. Examples of preferable fluoride phosphors include $K_2SiF_6$:$Mn^{4+}$; examples of preferable nitride phosphors include $CaAlSiN_3$:$Eu^{2+}$ and $(Sr,Ca)AlSiN_3$:$Eu^{2+}$; examples of preferable oxinitride phosphors include Ca-α-SiAlON:$Eu^{2+}$; and examples of preferable sulfide phosphors include CaS:$Eu^{2+}$.

Prior to transmission of the light through color filters, when the emission intensity at the emission peak of the blue light emitting element 2 is taken as 1, it is preferable that the emission intensity at the emission peak of the red phosphor 4 be 0.1 to 2.5. In other words, when the spectral intensity at the emission peak of the blue light in the wavelength region of 440 nm to 460 nm is taken as 1, it is preferable that the spectral intensity at the emission peak of the red light in the wavelength region of 600 nm to 690 nm be 0.1 to 2.5. Due to the red phosphor 4 having the above described emission intensity, the light source device 1A has an emission spectrum having an increased intensity in the red wavelength region. This results in an increase in brightness obtained when using the light source device 1A.

Absorbent

The absorbent 5 contains neodymium fluoride. Neodymium fluoride is a fluoride represented by the general formula $Nd_{1-x}R_xF_3$, where R denotes a rare earth element other than neodymium and $0 \leq X < 1$, i.e., the fluoride may contain not only neodymium but also another rare earth element. It is however to be noted that the neodymium fluoride represented by $NdF_3$ is most preferable.

Neodymium fluoride has a narrow absorption spectrum in the yellow wavelength region of 570 nm to 600 nm, i.e., a particular wavelength region where emission spectra of green light and red light overlap, and serves to attenuate the light of the light source device 1A in the particular wavelength region (yellow wavelength region). In addition, unlike neodymium oxide used in conventional light source devices as a filter material, neodymium fluoride does not significantly attenuate the light in the emission spectrum of the green phosphor (green light).

The absorbent 5 may be of amorphous neodymium glass containing $SiO_2$, alkali metal compound, alkaline earth metal oxide, and neodymium fluoride. It is, however, preferable that the absorbent 5 be a crystalline compound in a fine particle state containing neodymium fluoride, in view of light-absorbing efficiency in a particular wavelength region. Preferably, particles of the crystalline absorbent have an average diameter of 0.1 μm to 5 μm.

The light source device 1A has an absorbent containing neodymium fluoride. This serves to attenuate the light in the particular wavelength region (yellow wavelength region), and does not significantly attenuate the light in the emission spectrum of the green phosphor 3 (green light). As a result, when the light from the light source device 1A serving as a white light source is color-separated with color filters to use the resulted colors as three primary colors, i.e., when the light source device 1A is used as a backlight light source of a liquid crystal display device, the amount of the yellow light mixed into the light transmitted through the red filter and the light transmitted through the green filter is reduced and there is no significant decrease in the intensity of light in the green wavelength region. This allows the light obtained using the light source device 1A to have a wider color reproduction range, and does not cause a significant decrease in the brightness of light.

First Light-Transmissive Member

The first light-transmissive member 6 encapsulates the blue light emitting element 2 and contains the green phosphor 3, the red phosphor 4, and the absorbent 5. Preferably, the first light-transmissive member 6 contains a light-diffusing material. Preferably, the first light-transmissive member 6 is made of a light-transmissive resin material, such as an epoxy resin or a silicone resin, in which the green phosphor 3, the red phosphor 4, and the absorbent 5 are dispersed. Incidentally, the resin material may be other than an epoxy resin or a silicone resin if the resin material is light-transmissive.

In the first light-transmissive member 6, the content of the absorbent 5 with respect to the total mass of the first light-transmissive member 6 is preferably 0.1% by mass to 15.0% by mass. If the content of the absorbent 5 is less than 0.1% by mass, the decrease in the intensity of light in the yellow wavelength region is so small that the color reproduction range achieved in the use of the light source device is not as wide as expected. If the content of the absorbent 5 is greater than 15.0% by mass, the decrease in the intensity of the light in the emission spectrum of the green phosphor (green light) is so significant that the decrease in the brightness of light in the use of the light source device is likely to occur.

The content of the green phosphor 3 and the content of the red phosphor 4 are determined to control the emission intensities at the emission peaks of these phosphors within predetermined ranges with respect to the emission intensity at the emission peak of the blue light emitting element 2. Preferably, the content of the green phosphor 3 is 0.5% by mass to 25% by mass and the content of the red phosphor 4 is 1% by mass to 45% by mass, each with respect to the total mass of the first light-transmissive member 6. In addition, with regard to the mass ratio between these phosphors, the mass ratio of green phosphor versus red phosphor (mass of green phosphor:mass of red phosphor) is preferably 1:99 to 95:5.

In the resin material of the first light-transmissive member 6, light-diffusing materials, such as $SiO_2$, may further be dispersed in addition to the green phosphor 3, the red phosphor 4, and the absorbent 5. The content of the light-diffusing material is preferably 1% by mass to 15% by mass with respect to the total mass of the first light-transmissive member 6.

In the light source device 1A, a light emitting device 10A is constituted by the blue light emitting element 2 and the first light-transmissive member 6 containing the green phosphor 3, the red phosphor 4, and the absorbent 5. The light emitting device 10A thereby emits a mixture of blue, green, and red light, i.e., white light, to function as a white light source. A preferable embodiment of the light emitting device 10A is as follows.

As shown in FIG. 1, the light emitting device 10A has: the blue light emitting element 2; a case 7 having a recess 7a in which the blue light emitting element 2 is accommodated; two electrodes 8 which are supported by the case 7 and exposed on the underside of the case 7 and on the bottom surface of the recess 7a to have an electrical connection to the blue light emitting element 2 through wire or the like; and the first light-transmissive member 6 filled in the recess 7a in such a manner as to encapsulate the blue light emitting element 2, wherein the first light-transmissive member 6 contains the green phosphor 3, the red phosphor 4, and the absorbent 5. The light emitting device 10A is to be mounted on a mounting substrate on which a wiring pattern not shown has been formed. The light emitting device 10A shown in FIG. 1 is of the surface emitting type (top view type), in which white light emerges from a front surface (upper surface) of the device. The light emitting device 10A may be, however, of the side surface emission type (side view type), in which white light emerges from a side surface of the device.

As shown in FIG. 2, a light emitting device 10A according to the first embodiment may be structured such that the blue light emitting element 2, which is encapsulated by the first light-transmissive member 6 containing the green phosphor 3, the red phosphor 4, and the absorbent 5, is electrically connected through wire or the like to a wiring pattern 12a formed on a mounting substrate 12, without using the case 7.

The light emitting device 10A is not limited to the form shown in FIGS. 1 and 2, in which a single blue light emitting element 2 is encapsulated by the first light-transmissive member 6, but may be in a form in which a plurality of blue light emitting elements 2 are encapsulated by the first light-transmissive member 6, though not illustrated in drawings.

The light emitting device 10A is not limited to the form shown in FIGS. 1 and 2, in which the green phosphor 3, the red phosphor 4, and the absorbent 5 are evenly dispersed in the first light-transmissive member 6, but is preferably in a form (not shown) in which they are unevenly dispersed. For example, the light emitting device 10A is preferably in a form in which the green phosphor 3 and the red phosphor 4 are dispersed in the vicinity of the blue light emitting element 2, and the absorbent 5 is dispersed in the vicinity of the top of the space of the recess 7a (emission surface). The green phosphor 3, the red phosphor 4, and the absorbent 5 being unevenly dispersed in the first light-transmissive member 6 in such a manner increases the light absorption by the absorbent 5 in a particular wavelength region.

Second Embodiment

Figure 3:
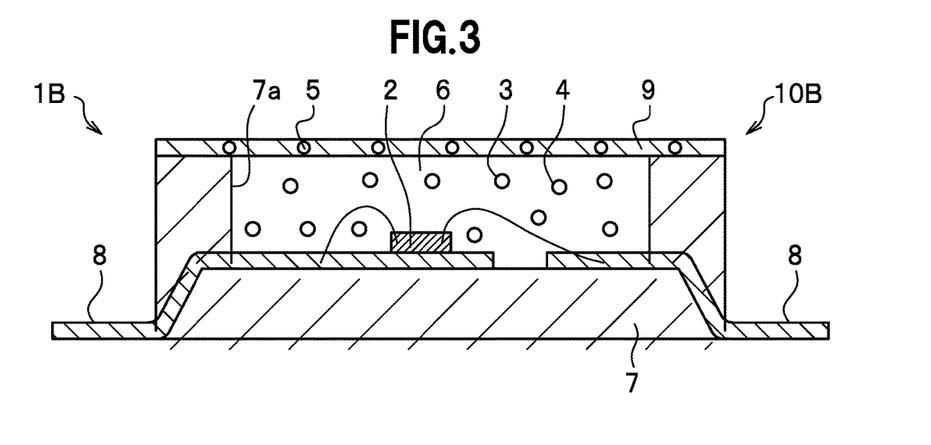
FIG. 3 is a cross section showing the structure of a light source device according to a second embodiment.

A light source device according to a second embodiment will be described with reference to FIG. 3. FIG. 3 is a cross section showing the structure of a light source device according to the second embodiment.

As shown in FIG. 3, a light source device 1B according to the second embodiment has a blue light emitting element 2, a green phosphor 3, a red phosphor 4, an absorbent 5, a first light-transmissive member 6, and a second light-transmissive member 9. The second light-transmissive member 9 contains the absorbent 5.

In the light source device 1B, the second light-transmissive member 9 contains the absorbent 5. This allows the light obtained using the light source device 1B to have a wider color reproduction range, and does not cause a significant decrease in the brightness. As a result, the light source device 1B is preferably used as a backlight light source of a liquid crystal display device.

Hereinafter, a description will be given of the light source device 1B with respect to the components thereof. The blue light emitting element 2, the green phosphor 3, the red phosphor 4, the absorbent 5 are the same as those of the above described first embodiment, and the first light-transmissive member 6 is the same as that of the first embodiment except that it does not contain the absorbent 5, and thus descriptions thereof will be omitted.

Second Light-Transmissive Member

The second light-transmissive member 9 covers the first light-transmissive member 6, contains the absorbent 5, and preferably contains a light-diffusing material. Preferably, the second light-transmissive member 9 is made of a light-transmissive resin material, such as an epoxy resin, a modified epoxy resin, a hard silicone resin, and a hard, modified silicone resin, in which the absorbent 5 is dispersed. Incidentally, the second light-transmissive member 9 may be made of a resin material other than the above if the resin material is light-transmissive. Preferably, the second light-transmissive member 9 has a film thickness of about 5 to 100 μm, but is not limited thereto.

In the second light-transmissive member 9, the content of the absorbent 5 with respect to the total mass of the second light-transmissive member 9 is preferably 0.1% by mass to 15.0% by mass. If the content of the absorbent 5 is less than 0.1% by mass, the decrease in the intensity of light in the yellow wavelength region is so small that the color reproduction range achieved in the use of the light source device is not as wide as expected. If the content of the absorbent 5 is greater than 15.0% by mass, the decrease in the spectral intensity at the emission peak of the green phosphor is so significant that the decrease in the brightness of the light in the use of the light source device is likely to occur.

In the resin material of the second light-transmissive member 9, in addition to the absorbent 5, one or more light-diffusing materials may further be dispersed. Examples of such light-diffusing materials include: glass filler, silica, alumina, titanium oxide, magnesium oxide, antimony oxide, aluminum hydroxide, barium sulfate, magnesium carbonate, and barium carbonate. The content of the light-diffusing materials with respect to the total mass of the second light-transmissive member 9 is preferably 0.1% by mass to 30% by mass.

In the light source device 1B, a light emitting device 10B is constituted by: the blue light emitting element 2; the first light-transmissive member 6 containing the green phosphor 3 and the red phosphor 4; and the second light-transmissive member 9 containing the absorbent 5. The light emitting device 10B thereby emits white light to function as a white light source. A preferable embodiment of the light emitting device 10B is as follows.

As shown in FIG. 3, the light emitting device 10B has the second light-transmissive member 9 disposed on the upper surface of the case 7 in such a manner as to cover the first light-transmissive member 6 of the light emitting device 10A shown in FIG. 1, wherein the first light-transmissive member 6 contains the green phosphor 3 and the red phosphor 4, and wherein the second light-transmissive member 9 contains the absorbent 5. The light emitting device 10B is to be mounted on a mounting substrate on which a wiring pattern not shown has been formed. Alternatively, the light emitting device 10B may be constituted by the light emitting device 10A shown in FIG. 2 and a second light-transmissive member 9 covering the first light-transmissive member 6 of the light emitting device 10A.

The light emitting device 10B shown in FIG. 3 is of the surface emitting type (top view type), in which case white light emerges from a front surface (upper surface) of the device. The light emitting device 10B may be, however, of the side surface emission type (side view type) not shown, in which case white light emerges from a side surface of the device. The light emitting device 10B is not limited to the form shown in FIG. 3, in which a single blue light emitting element 2 is encapsulated by the first light-transmissive member 6, but may be in a form in which a plurality of blue light emitting elements 2 are encapsulated by the first light-transmissive member 6, though not illustrated in drawings.

Third Embodiment

Figure 4:
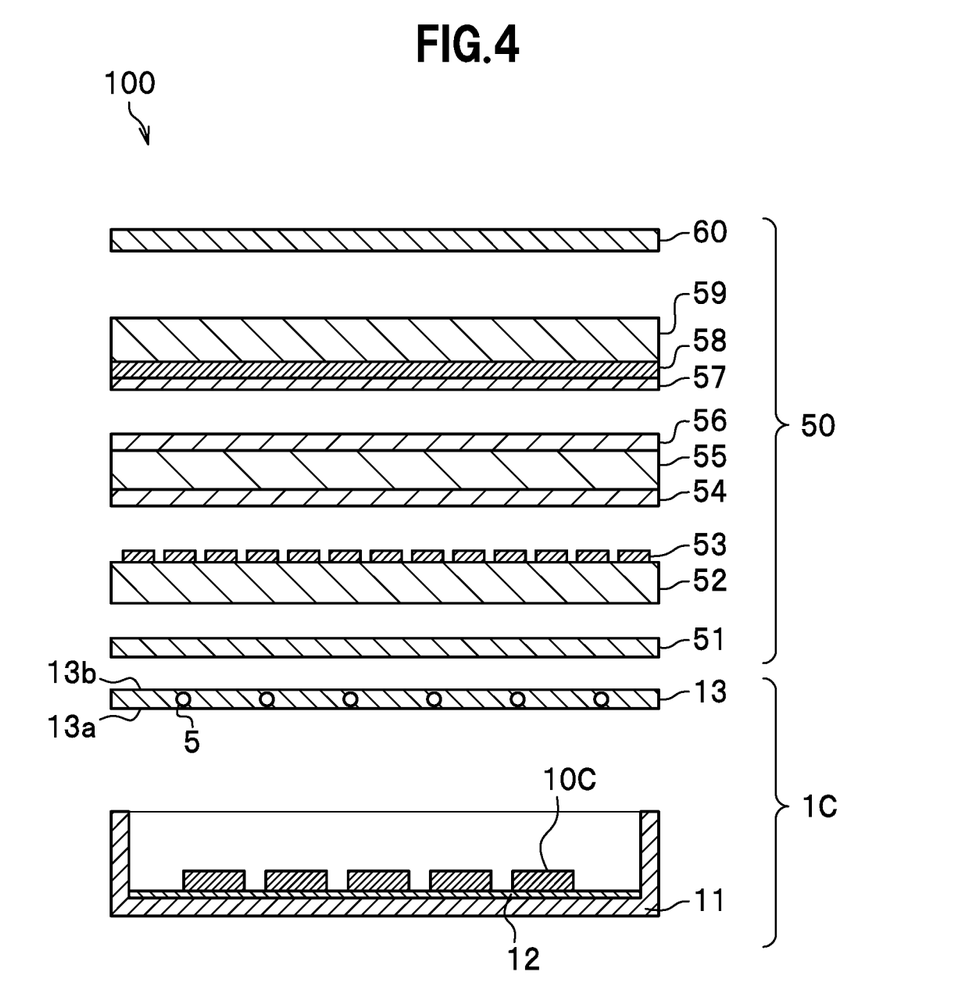
FIG. 4 is a cross section which shows the structure of a light source device according to a third embodiment as well as the structure of a liquid crystal display device in which the light source device is used.

A light source device according to a third embodiment will be described with reference to FIG. 4. FIG. 4 is a cross section which shows the structure of a light source device according to the third embodiment as well as the structure of a liquid crystal display device in which the light source device is used.

As shown in FIG. 4, the light source device 1C according to the third embodiment has a light emitting device 10C and a light diffusion plate 13. The light emitting device 10C is constituted by a blue light emitting element, a green phosphor, and a red phosphor. The light diffusion plate 13 contains an absorbent 5. With this structure, the light source device 1C emits a mixture of blue, green, and red light, i.e., white light, to function as a white light source.

In the light source device 1C, the light diffusion plate 13 contains the absorbent 5. This allows the light obtained using the light source device 1C to have a wide color reproduction range, and does not cause a significant decrease in the brightness. As a result, the light source device 1C is preferably used as a backlight light source of a direct type liquid crystal display device 100.

Hereinafter, a description will be given of the light source device 1C with respect to the components thereof. The blue light emitting element, the green phosphor, the red phosphor, and the absorbent 5 are the same as those of the above described first embodiment, and thus descriptions thereof will be omitted.

Light Diffusion Plate

The light diffusion plate 13 is a plate-like body having; one principal surface 13a into which a mixture of the blue, green, and red light emitted from the light emitting device 10C, i.e., white light, enters; and the other principal surface 13b from which the mixture emerges. The light diffusion plate 13 serves to provide a uniform distribution of light by diffusing the white light, and thus eliminating in-plane brightness unevenness.

Preferably, the light diffusion plate 13 is made of a light-transmissive resin material, such as an acrylic resin, in which the absorbent 5 and light-diffusing materials, such as $SiO_2$, are dispersed. Incidentally, the light-transmissive resin material may be a resin material other than an acrylic resin if the resin material has a light-transmissive property. The light-diffusing material may be an inorganic light-diffusing material other than $SiO_2$ or an organic light-diffusing material, if the material has a light-diffusing property.

In the light diffusion plate 13, the content of the absorbent 5 with respect to the total mass of the light diffusion plate 13 is preferably 0.1% by mass to 15.0% by mass. If the content of the absorbent 5 is less than 0.1% by mass, the decrease in the intensity of light in the yellow wavelength region is so small that the color reproduction range achieved in the use of the light source device is not as wide as expected. If the content of the absorbent 5 is greater than 15.0% by mass, the decrease in the spectral intensity at the emission peak of the green phosphor is so significant that the decrease in the brightness of the light in the use of the light source device is likely to occur. The content of the light-diffusing material with respect to the total mass of the light diffusion plate 13 is preferably 0.1% by mass to 30% by mass.

A preferable embodiment of the light source device 1C is as follows.

As shown in FIG. 4, the light source device 1C has a light emitting device 10C, a case body 11 that accommodates a mounting substrate 12 on which the light emitting device 10C is mounted, and a light diffusion plate 13. Preferably, the case body 11 is disposed on the back surface side of the light diffusion plate 13, which back surface side is opposite to the principal surface 13a of the light diffusion plate 13. Preferably, in the light source device 1C, a plurality of light emitting devices 10C are mounted on the mounting substrate 12.

The light source device 1C may have a brightness enhancement film (BEF) as a luminance increasing film and/or a dual brightness enhancement film (DBEF) as a reflective polarizing film, on the upper surface of the light diffusion plate 13.

In the light source device 1C, the light emitting devices 10C are preferably implemented using the light emitting device 10A having the first light-transmissive member 6 as shown in FIGS. 1 and 2, or preferably implemented using the light emitting device 10B having the first light-transmissive member 6 and the second light-transmissive member 9 as shown in FIG. 3. In those cases, it is preferable that the first light-transmissive member 6 and the second light-transmissive member 9 do not contain the absorbent 5. In addition, the light emitting device 10C is preferably of the surface emitting type.

Fourth Embodiment

Figure 5:
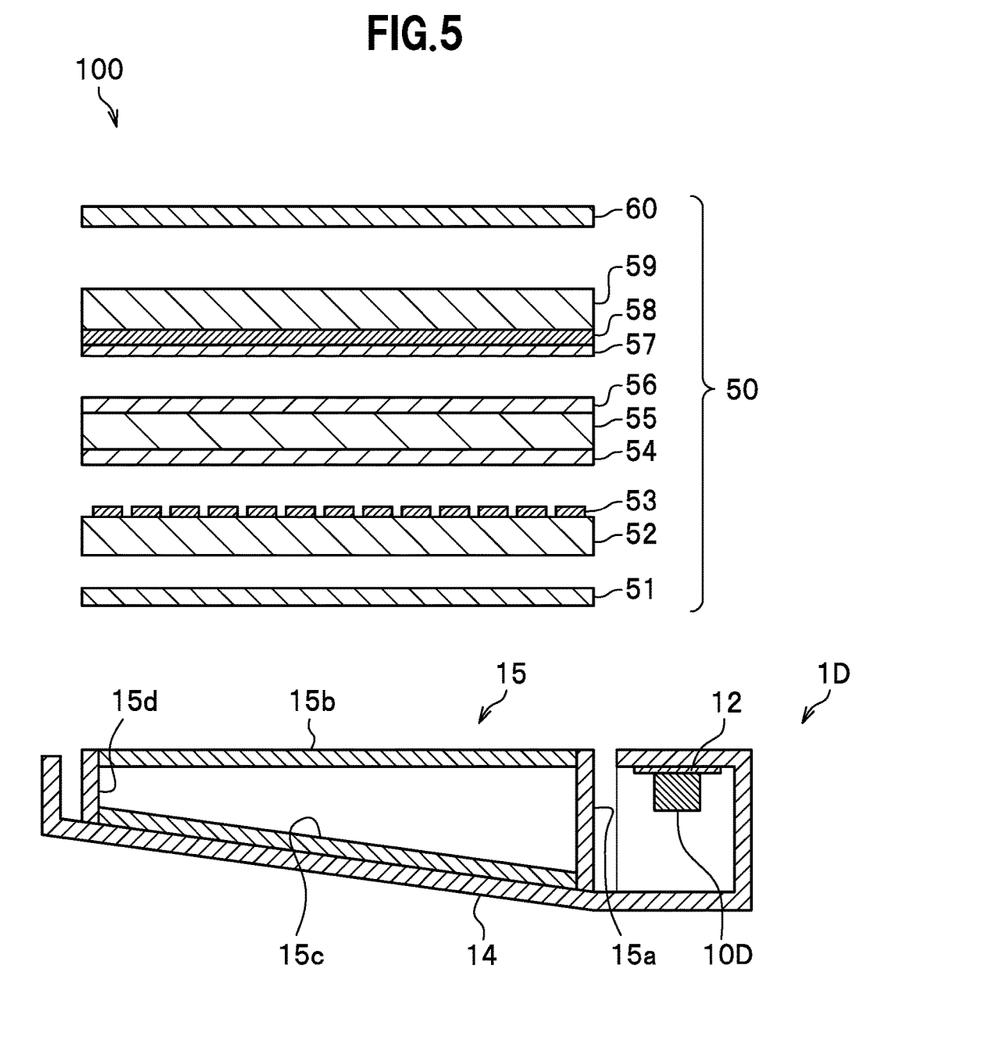
FIG. 5 is a cross section which shows the structure of a light source device according to a fourth embodiment as well as the structure of a liquid crystal display device in which the light source device is used.

A light source device according to a fourth embodiment will be described with reference to FIG. 5. FIG. 5 is a cross section which shows the structure of a light source device according to the fourth embodiment as well as the structure of a liquid crystal display device in which the light source device is used.

As shown in FIG. 5, the light source device 1D according to the fourth embodiment has a light emitting device 10D and a light guide plate 15. The light emitting device 10D is constituted by a blue light emitting element, a green phosphor, and a red phosphor. The light guide plate 15 contains an absorbent 5. With this structure, the light source device 1D emits a mixture of blue, green, and red light, i.e., white light, to function as a white light source.

In the light source device 1D, the light guide plate 15 contains the absorbent 5. This allows the light obtained using the light source device 1D to have a wide color reproduction range, and does not cause a significant decrease in the brightness. As a result, the light source device 1D is preferably used as a backlight light source of an edge-light type liquid crystal display device 100.

Hereinafter, a description will be given of the light source device 1D with respect to the components thereof. The blue light emitting element, the green phosphor, the red phosphor, the absorbent 5 are the same as those of the above described first embodiment, and thus descriptions thereof will be omitted.

Light Guide Plate

The light guide plate 15 is a plate-like body having: a side surface into which a mixture of the blue, green, and red light emitted from the light emitting device 10D, i.e., white light, enters; and at least one principal surface from which the mixture emerges. Preferably, the light guide plate 15 is a structure constituted by substantially flat-plate-shaped members and having at least six surfaces. In other words, as shown in FIG. 5, the light guide plate 15 preferably has: an incident surface (plate) 15a located at a first side surface; a primary reflecting surface (plate) 15c, i.e., a first principal surface, located at the bottom surface; an emission surface (plate) 15b, i.e., a second principal surface, located at the front surface opposing the bottom surface; a secondary reflecting surface (plate) 15d located at a second side surface opposing the first side surface; and two secondary reflecting surfaces (plates) respectively located at not shown left and right side surfaces adjoining the first side surface.

The light guide plate 15 takes in white light by the incident surface 15a and guides the white light to every corner inside the light guide plate 15 by internal reflection between the primary reflecting surface 15c, the emission surface 15b, and the secondary reflecting surface 15d. When the angle of the white light with respect to the emission surface 15b exceeds a critical angle, the white light goes through the emission surface 15b and emerges from the light guide plate 15 in a planar fashion. Incidentally, the critical angle is an incident angle at which total reflection of light occurs when the light enters from a medium with a high refractive index to a medium with a low refractive index.

Preferably, as shown in FIG. 5, the light guide plate 15 is formed such that the thickness of the light guide plate 15 gradually decreases from the incident surface 15a to the secondary reflecting surface 15d. This shape of the light guide plate 15 facilitates penetration of white light into the light guide plate 15 at an angle at which total reflection occurs at the emission surface 15b (i.e., at the critical angle). As a result, the brightness of the light emerging from the light guide plate 15 is increased as compared to a case where the light guide plate 15 has a uniform thickness.

Preferably, each of the surfaces of the light guide plate 15 is made of a light-transmissive resin material, such as an acrylic resin, in which the absorbent 5 is dispersed. Incidentally, the light-transmissive resin material may be a resin material other than an acrylic resin if the resin material has a light-transmissive property. Preferably, every surface of the light guide plate 15 contains the absorbent 5. However, the absorbent 5 may be contained in the emission surface 15b only.

As to the primary reflecting surface 15c and the secondary reflecting surface 15d of the light guide plate 15, a white-colored material such as titanium oxide may be coated on the surfaces; alternatively, a metal such as aluminum may be vapor-deposited on the surfaces; yet alternatively, a resin sheet in which a white-colored material or metal may be dispersed in a resin material is bonded and fixed onto the surfaces.

In the light guide plate 15, the content of the absorbent 5 with respect to the total mass of the light guide plate 15 is preferably 0.1% by mass to 15.0% by mass. If the content of the absorbent 5 is less than 0.1% by mass, the decrease in the intensity of light in the yellow wavelength region is so small that the color reproduction range achieved in the use of the light source device is not as wide as expected. If the content of the absorbent 5 is greater than 15.0% by mass, the decrease in the spectral intensity at the emission peak of the green phosphor is so significant that the decrease in the brightness of the light in the use of the light source device is likely to occur.

A preferable embodiment of the light source device 1D is as follows. Preferably, as shown in FIG. 5, the light source device 1D has: a light emitting device 10D; a case body 14 that accommodates a mounting substrate 12 on which the light emitting device 10D is mounted; and a light guide plate 15, and the light guide plate 15 is accommodated in the case body 14 so as to be disposed on the side of a side surface of the light emitting device 10D. Preferably, in the light source device 1D, a plurality of light emitting devices 10D are mounted on the mounting substrate 12.

The light source device 1D may have, though not illustrated: a light reflecting sheet on the back surface side of the light guide plate 15 (primary reflecting surface 15c); a light diffusion sheet on the upper surface of the light guide plate 15 (emission surface 15b); and a prism sheet on the upper surface of the light diffusion sheet.

Examples of the light reflecting sheet include: a resin sheet on which a white-colored material is coated; a resin sheet onto which a metal is vapor-deposited; and a resin sheet in which a white-colored material or a metal is dispersed in a resin material. The light reflecting sheet serves to cause the white light having gone through the primary reflecting surface 15c of the light guide plate 15 to reflect or diffusely reflect from the outside of the light guide plate 15 to enter inside the light guide plate 15 again. As the light diffusion sheet, the above described light diffusion plate 13 can be used, in which case the absorbent 5 is not to be contained in the light diffusion sheet. The prism sheet has a surface on which a large number of microscopic triangular prisms are formed. The prisms cause refraction of incident light in the normal direction of the prism sheet to focus the light.

In the light source device 1D, the light emitting devices 10D each may be implemented using the light emitting device 10A having the first light-transmissive member 6 as shown in FIGS. 1 and 2, or using the light emitting device 10B having the first light-transmissive member 6 and the second light-transmissive member 9 as shown in FIG. 3. In those cases, it is preferable that the first light-transmissive member 6 and the second light-transmissive member 9 do not contain the absorbent 5. In addition, the light emitting device 10D is preferably of the surface emitting type but may be of the side surface emission type.

A light source device according to the present invention is not limited to the above described first to fourth embodiments. For example, the light source devices 1A and 1B according to the first and second embodiments each may be configured to further have the light diffusion plate 13 shown in FIG. 4 or the light guide plate 15 shown in FIG. 5. In those cases, it is preferable that the light diffusion plate 13 and the light guide plate 15 do not contain the absorbent 5.

Next, a description will be given of a liquid crystal display device in which the light source device is used as a backlight light source with reference to FIGS. 4 and 5. FIG. 4 is a cross section which shows the structure of a light source device according to the third embodiment as well as the structure of a liquid crystal display device in which the light source device is used. FIG. 5 is a cross section which shows the structure of a light source device according to the fourth embodiment as well as the structure of a liquid crystal display device in which the light source device is used. Incidentally, FIG. 4 shows the structure of a direct type liquid crystal display device; and FIG. 5 shows the structure of an edge-light type liquid crystal display device.

A liquid crystal display device 100 has a liquid crystal panel 50 as well as a light source device 1C or a light source device 1D, which is disposed on the back surface side of the liquid crystal panel 50. The light source device 1C and the light source device 1D are the same as those described above, and thus descriptions thereof will be omitted.

The liquid crystal panel 50 has, in the following order from the side of the light source device 1C or light source device 1D; a polarization filter 51, a glass substrate 52, a transparent electrode 53, an alignment film 54, a liquid crystal layer 55, an alignment film 56, a transparent electrode 57, a color filter 58, a glass substrate 59, and a polarization filter 60.

The polarization filters 51 and 60 serve to produce light oscillating in a particular direction. The glass substrates 52 and 59 serve to prevent electricity from electrodes (transparent electrodes 53 and 57) from flowing into other parts. The transparent electrodes 53 and 57 serve to drive the liquid crystal panel 50. The alignment films 54 and 56 cause liquid crystal molecules contained in the liquid crystal layer 55 to be arranged in a predetermined direction. The liquid crystal layer 55 is filled with liquid crystal material. The color filter 58 has sub-pixels on each of which a blue, green, or red color filter is arranged.

Examples

Figure 6:
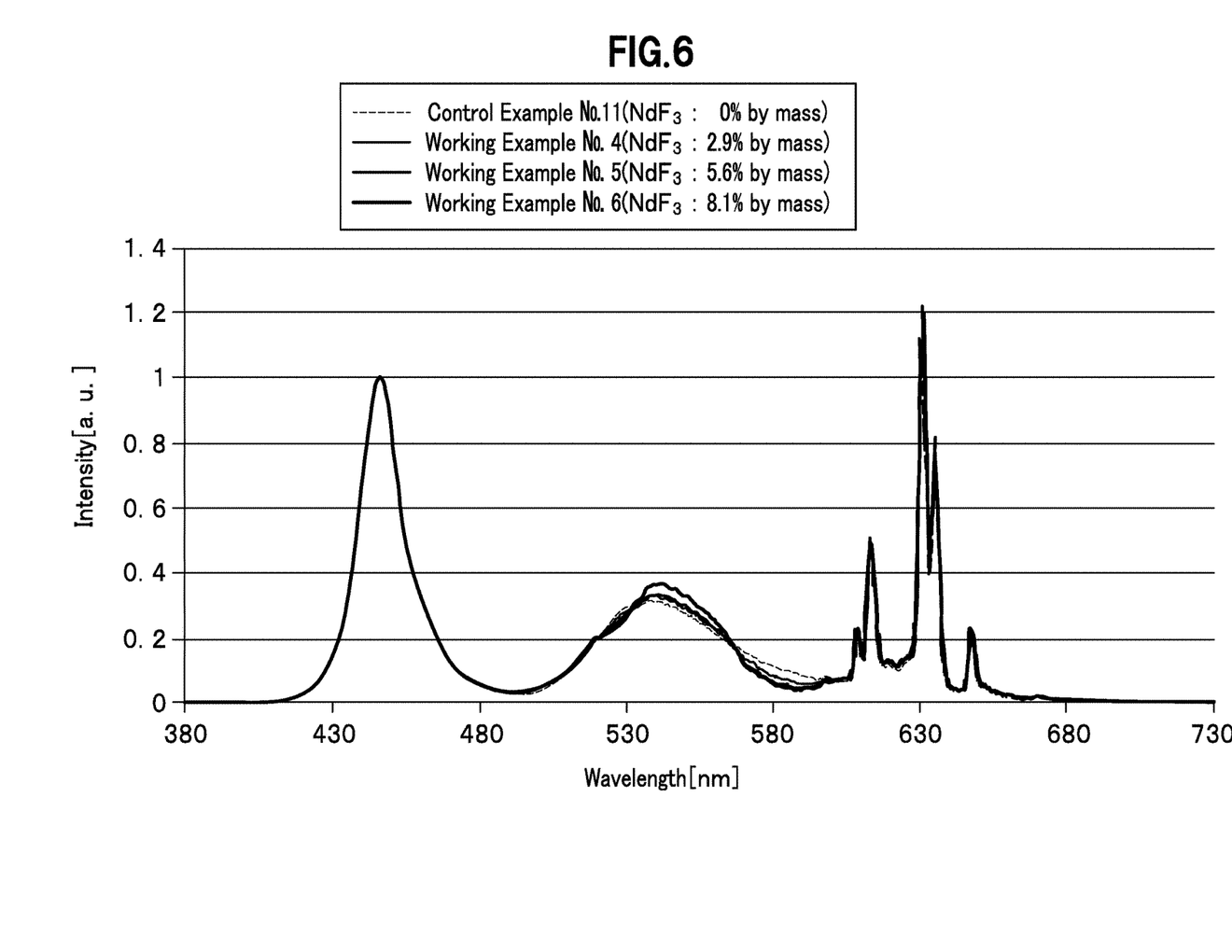
FIG. 6 is a graph showing emission spectra of light source devices according to the first embodiment.
Figure 7:
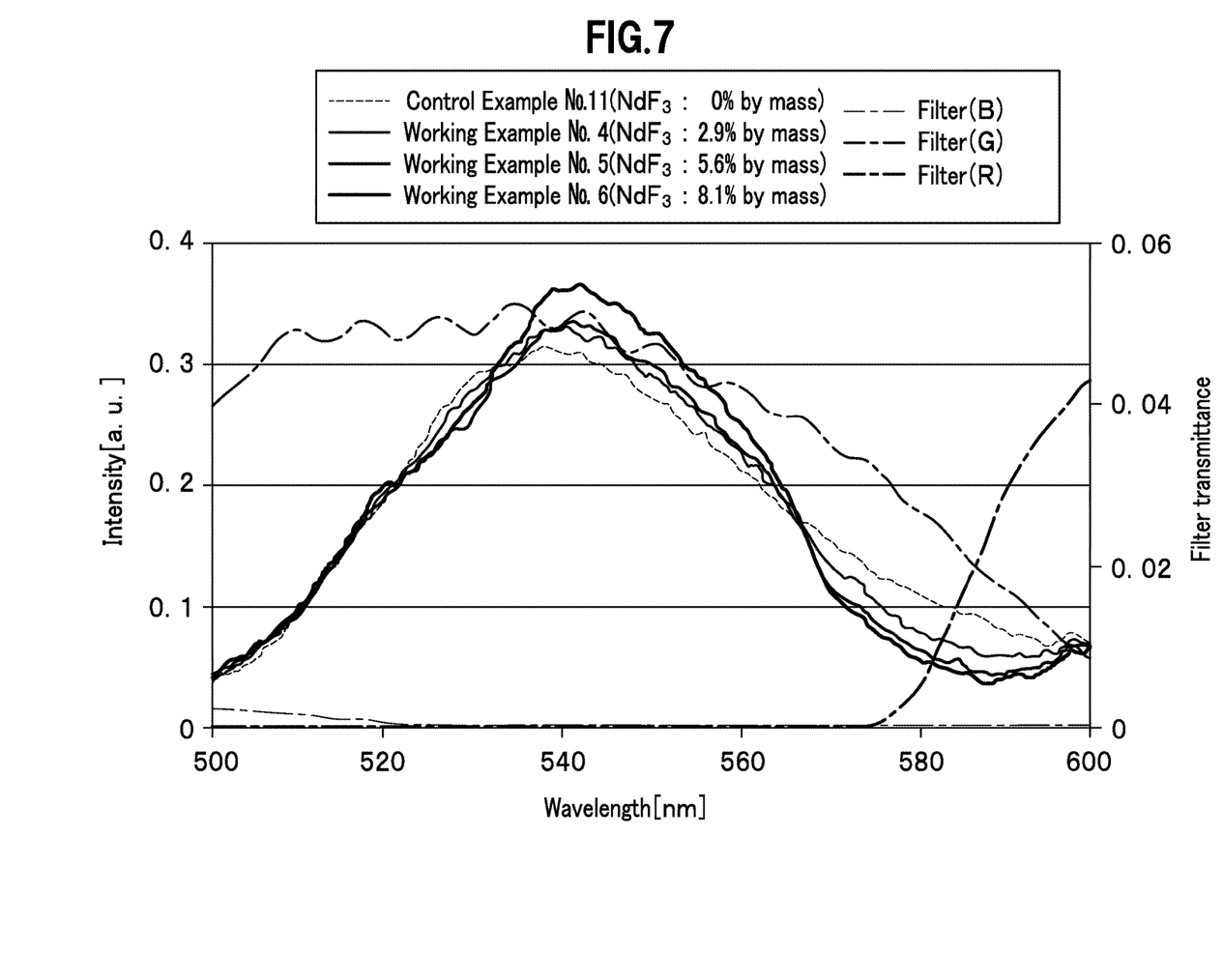
FIG. 7 is a graph showing an enlarged part of the emission spectra of the light source devices shown in FIG. 6, as well as spectral transmittance characteristics of R, G, and B color filters for liquid crystal.
Figure 8:
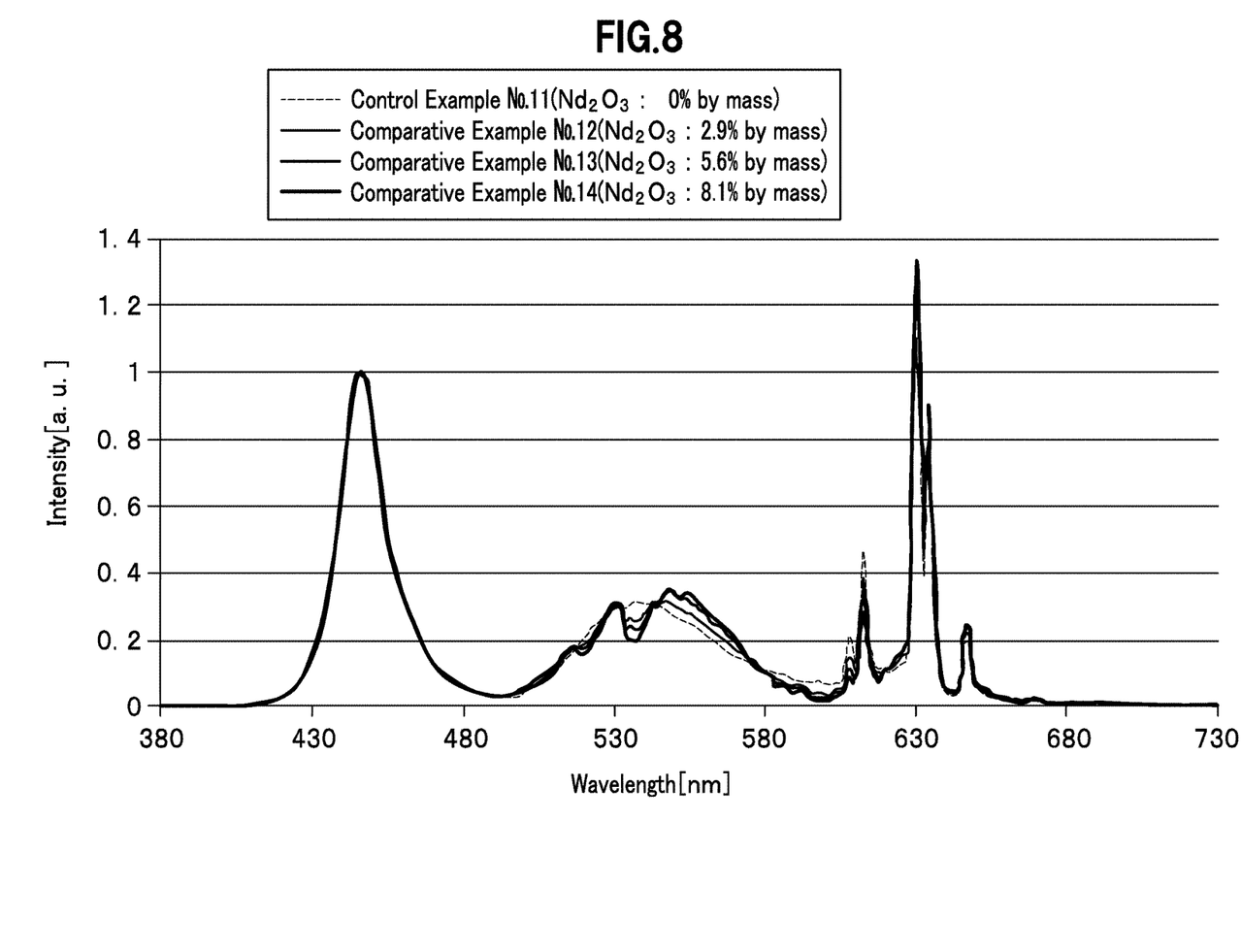
FIG. 8 is a graph showing emission spectra of conventional light source devices.
Figure 9:
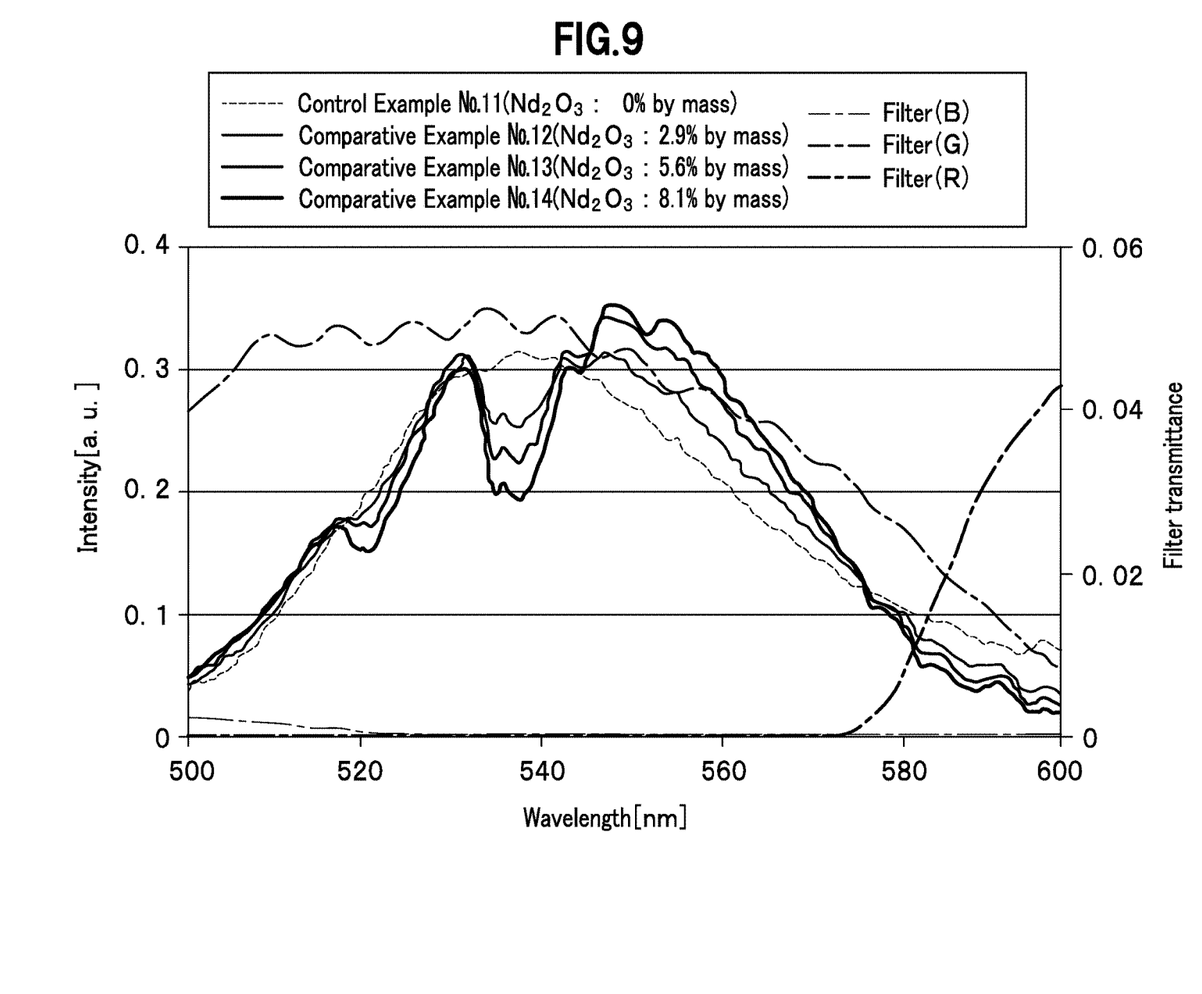
FIG. 9 is a graph showing an enlarged part of the emission spectra of the light source devices shown in FIG. 8, as well as spectral transmittance characteristics of R, G, and B color filters for liquid crystal.
Figure 10:
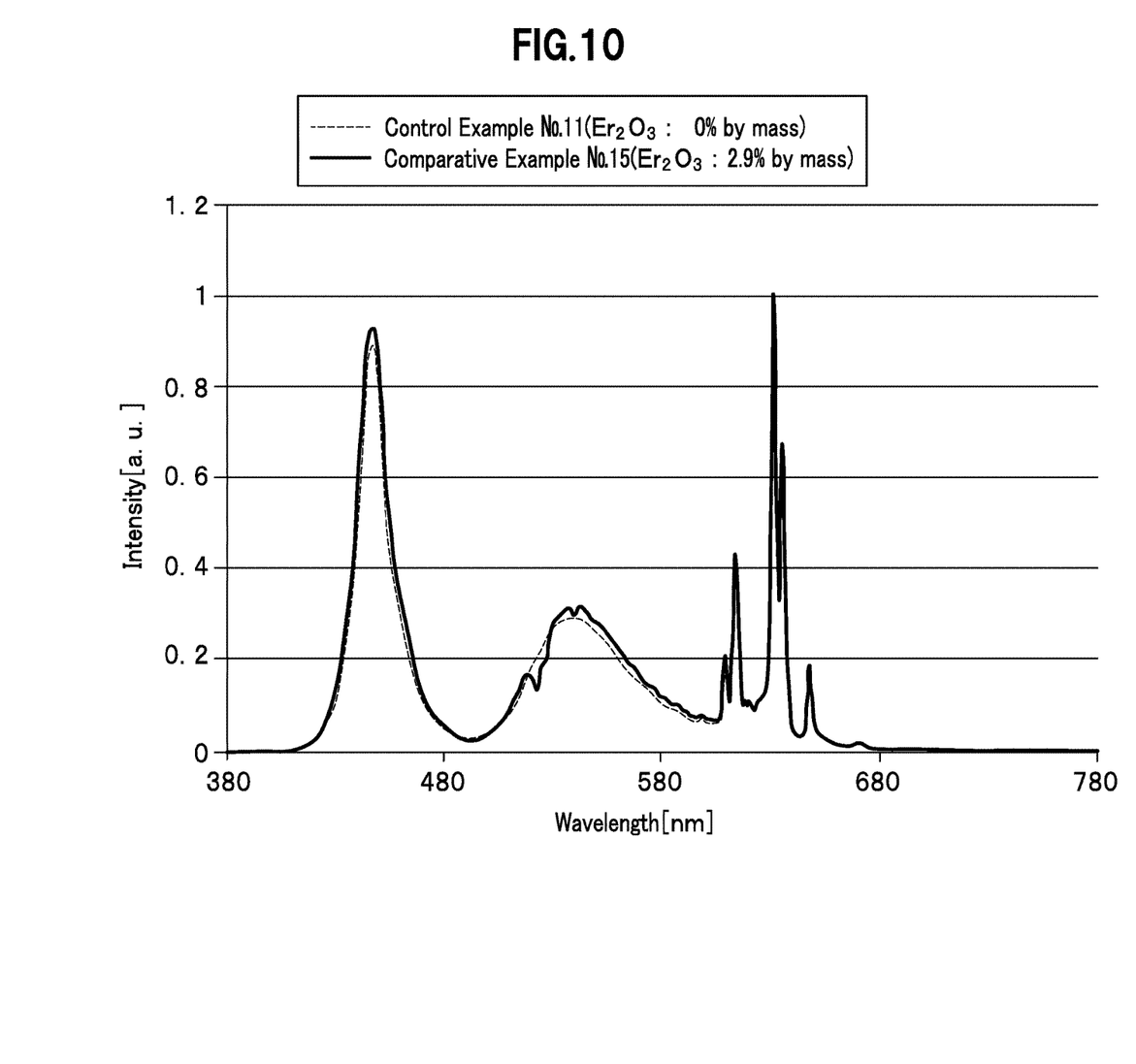
FIG. 10 is a graph showing emission spectra of conventional light source devices.

A description will be given of the examples satisfying the requirements of the present disclosure and Comparative Examples not satisfying the requirements of the present disclosure with reference to FIGS. 1 and 6 to 10. FIG. 1 is a cross section showing the structure of a light source device according to the first embodiment. FIG. 6 is a graph showing emission spectra of light source devices (Working Examples) according to the first embodiment. FIG. 7 is a graph showing an enlarged part of the emission spectra of the light source devices shown in FIG. 6 with transmittance of R, G, and B color filters for liquid crystal. FIG. 8 is a graph showing emission spectra of conventional light source devices (examples of prior art). FIG. 9 is a graph showing an enlarged part of the emission spectra of the light source devices shown in FIG. 8 with transmittance of R, G, and B color filters for liquid crystal. FIG. 10 is a graph showing emission spectra of conventional light source devices (other examples of prior art).

Working Examples, Control Examples

As examples of the light emitting device illustrated in FIG. 1, Working Examples Nos. 1 to 10 were prepared using the components and materials listed below using the amounts shown in Table 1. Control Example No. 11 was prepared using the amounts shown in Table 1 in the same manner as Working Examples Nos. 1 to 10 of the light emitting device illustrated in FIG. 1, except that Control Example No. 11 did not contain a light-absorbing material.
Blue light emitting element: Nitride semiconductor
Base material of first light-transmissive member: Hybrid resin of epoxy and silicone, with a refractive index of 1.52
  Green phosphor: β-SiAlON:$Eu^{2+}$ phosphor
  Red phosphor: $K_2SiF_6$:$Mn^{4+}$ phosphor
  Light-diffusing material: $SiO_2$
  Absorbent: $NdF_3$
The light emission spectra of the prepared light emitting devices driven at a current of 20 mA were measured. Based on the measured spectrum data and transmittance spectrum data of the red (R), green (G), and blue (B) color filters of a liquid crystal panel to be used with the light emitting device (light source device), DCI-P3 gamut coverage and panel brightness of the liquid crystal display device were simulated. The simulation results are presented in Table 1, each annotated with an evaluation result. The measured emission spectra of Working Examples Nos. 4 to 6 are presented in FIGS. 6 and 7. In FIGS. 6 and 7, the measured emission spectrum of Control Example No. 11 is also presented.

DCI-P3 is a standard for representing a color reproduction range, which is represented by a triangle on the xy chromaticity diagram the three points (x,y) of which are R(0.68, 0.32), G(0.265, 0.69), and B(0.15, 0.06). A DCI-P3 gamut coverage greater than 89.5% is taken as an indication of a wide color reproduction range and rated as "Good"; and a DCI-P3 gamut coverage of 89.5% or less is taken as an indication of a narrow color reproduction range and rated as "Poor".

The panel brightness data presented in Table 1 is represented in a relative brightness with respect to the panel brightness achieved by the conventional light emitting device (Control Example No. 11), which does not contain an absorbent, taken to be 100. A panel brightness of 75.0% or more is taken as an indication of low reduction in brightness and rated as "Excellent"; a panel brightness of less than 75.0% and not less than 70.0% is taken as an indication of no problematic reduction in brightness and rated as "Good"; and a panel brightness of less than 70.0% is taken as an indication of significant reduction in brightness and rated as "Poor".

Comparative Example

Comparative Examples Nos. 12 to 15 were prepared using the amounts shown in Table 1 in the same manner as Working Examples Nos. 1 to 10 of the light emitting device illustrated in FIG. 1, except that Comparative Examples Nos. 12 to 15 contain different absorbents. Those absorbents used in Comparative Examples were as follows:
  Absorbent: None, $Nd_2O_3$, $Er_2O_3$
The light emission spectra of the prepared light emitting devices driven by a current of 20 mA were measured in the same manner as Working Examples. Based on the measured spectrum data and predetermined data of color filters, DCI-P3 gamut coverage and panel brightness were simulated for each of the examples. The simulation results of the examples are presented in Table 1, each annotated with an evaluation result. FIGS. 8 to 10 show the measured emission spectra of Comparative Examples Nos. 12 to 15. It is noted that FIGS. 8 to 10 also show the measured emission spectrum of Control Example No. 11.

To clarify the differences between Working Examples and Comparative Examples from the results presented in Table 1, the relation of the content of the absorbent to the DCI-P3 gamut coverage and the panel brightness is presented in Table 2.

TABLE 1

| | | Configuration of light emitting device | | | | | | Evaluation result | | | |
|---|---|---|---|---|---|---|---|---|---|---|---|
| | | Green phosphor content | Red phosphor content | Phosphor mass ratio | | Lgiht-diffusing material content | Absorbent | | DCI-P3 gamut coverage | | Panel brightness |
| No. | | (mass %) | (mass %) | Green | Red | (mass %) | Composition | Content (mass %) | (%) | rating | (rel. %) rating |
| Working Examples | 1 | 11.5 | 26.7 | 30 | 70 | 2.9 | $NdF_3$ | 0.1 | 89.6 | Good | 99.5 Excellent |
| | 2 | 11.4 | 26.7 | 30 | 70 | 2.9 | $NdF_3$ | 0.3 | 89.7 | Good | 99.4 Excellent |
| | 3 | 11.3 | 26.5 | 30 | 70 | 2.9 | $NdF_3$ | 1.2 | 90.2 | Good | 96.2 Excellent |
| | 4 | 11.1 | 26.0 | 30 | 70 | 2.9 | $NdF_3$ | 2.9 | 90.9 | Good | 94.9 Excellent |
| | 5 | 10.8 | 25.3 | 30 | 70 | 2.8 | $NdF_3$ | 5.6 | 91.5 | Good | 89.5 Excellent |
| | 6 | 10.5 | 24.6 | 30 | 70 | 2.7 | $NdF_3$ | 8.1 | 92.3 | Good | 86.9 Excellent |
| | 7 | 10.3 | 23.9 | 30 | 70 | 2.6 | $NdF_3$ | 10.5 | 92.5 | Good | 83.7 Excellent |
| | 8 | 9.8 | 22.8 | 30 | 70 | 2.5 | $NdF_3$ | 15.0 | 92.7 | Good | 79.1 Excellent |
| | 9 | 9.3 | 21.7 | 30 | 70 | 2.4 | $NdF_3$ | 19.0 | 92.7 | Good | 73.3 Good |
| | 10 | 8.9 | 20.7 | 30 | 70 | 2.3 | $NdF_3$ | 22.7 | 92.6 | Good | 70.4 Good |

TABLE 1-continued

| | | Configuration of light emitting device | | | | | | Evaluation result | | | |
|---|---|---|---|---|---|---|---|---|---|---|---|
| | | Green phosphor | Red phosphor | Phosphor mass ratio | | Lgiht-diffusing material | Absorbent | | DCI-P3 gamut coverage | | Panel brightness |
| No. | | content (mass %) | content (mass %) | Green | Red | content (mass %) | Composition | Content (mass %) | (%) | rating | (rel. %) | rating |
| Control Example | 11 | 11.5 | 26.8 | 30 | 70 | 2.9 | None | 0.0 | 89.5 | Poor | 100.0 | — |
| Comparative Examples | 12 | 11.1 | 26.0 | 30 | 70 | 2.9 | $Nd_2O_3$ | 2.9 | 89.1 | Poor | 85.2 | Excellent |
| | 13 | 10.8 | 25.3 | 30 | 70 | 2.8 | $Nd_2O_3$ | 5.6 | 88.8 | Poor | 74.1 | Good |
| | 14 | 10.5 | 24.6 | 30 | 70 | 2.7 | $Nd_2O_3$ | 8.1 | 87.9 | Poor | 65.5 | Poor |
| | 15 | 11.1 | 26.0 | 30 | 70 | 2.9 | $Er_2O_3$ | 2.9 | 88.1 | Poor | 96.1 | Excellent |

TABLE 2

| | | Absorbent content (mass %) | | |
|---|---|---|---|---|
| | | 2.9 | 5.6 | 8.1 |
| Panel brightness (Relative %) | Working Examples Nos. 4 to 6 ($NdF_3$) | 94.9 | 89.5 | 86.9 |
| | Comparative Examples Nos. 12 to 14 ($Nd_2O_3$) | 85.2 | 74.1 | 65.5 |

As shown in Table 1, Working Examples Nos. 1 to 10 each had a wide color reproduction range represented by a DCI-P3 gamut coverage and thus were rated "Good". Working Examples Nos. 1 to 10 each showed a small decrease in panel brightness from Control Example No. 11 and thus were rated "Excellent" or "Good". Moreover, as shown in Table 2, Working Examples Nos. 4 to 6 each presented a smaller decrease in panel brightness that occurred due to an increase in the content of the absorbent, compared to Comparative Examples Nos. 12 to 14.

This is due to the fact that, as shown in FIGS. 6 and 7, in Working Examples Nos. 4 to 6, since the first light-transmissive member contains an absorbent ($NdF_3$), there is a decrease in the intensity of light in a particular wavelength region (570 nm to 600 nm) where the transmittance spectra of the red (R) and green (G) color filters overlap, but there is only a small decrease in the intensity of the light in the emission spectrum of the green phosphor (green light).

As shown in Table 1, Comparative Examples Nos. 12 to 15 each had a narrow color reproduction range represented by a DCI-P3 gamut coverage and thus were rated "Poor". Some of Comparative Examples Nos. 12 to 15 had a significant decrease in the panel brightness from the panel brightness of Control Example No. 11 as the content of absorbent was increased. Furthermore, as shown in Table 2, the decrease in the panel brightness that is due to an increase in the content of absorbent is greater in Comparative Examples Nos. 12 to 14 than that in Working Examples Nos. 4 to 6.

This is due to the fact that, as shown in FIGS. 8 and 9, in the Comparative Examples Nos. 12 to 14, since the first light-transmissive member contains an absorbent ($Nd_2O_3$), there is a decrease in the intensity of light in the particular wavelength region where the transmittance spectra of the red (H) and green (G) color filters overlap, and there is also a decrease in the intensity of the light in the emission spectrum of the green phosphor (green light). As to Comparative Example No. 15, the decrease in the panel brightness is due to the fact that the first light-transmissive member contains an absorbent of $Er_2O_3$ and thus there is a decrease in the intensity of the light in the emission spectrum of the green phosphor (green light) as shown in FIG. 10. Incidentally, as to Comparative Example No. 15, no decrease was observed in the intensity of the light in the particular wavelength region where the transmittance spectra of the R and G color filters overlap.

Obviously, numerous modifications and variations of the present invention are possible in light of the above teachings. It is therefore to be understood that within the scope of the appended claims, the invention may be practiced otherwise than as specifically described herein.

The invention claimed is:

1. A light source device comprising:
   (i) a blue light emitting element that emits blue light having an emission peak in a wavelength region of 440 nm to 460 nm; and
   (ii) a light-transmissive member that encapsulates the blue light emitting element and contains:
      (a) a green phosphor that absorbs part of the blue light emitted by the blue light emitting element and thereby emits green light having an emission peak in a wavelength region of 500 nm to 575 nm;
      (b) a red phosphor that absorbs at least one of part of the blue light emitted by the blue light emitting element and part of the green light emitted by the green phosphor, and thereby emits red light having an emission peak in a wavelength region of 600 nm to 690 nm; and
      (c) an absorbent containing neodymium fluoride that absorbs part of the green light and part of the red light,
   wherein the content ratio of the absorbent is 0.1 mass % to 15.0 mass % with respect to a total mass of the light-transmissive member.

2. A light source device as set forth in claim 1, wherein the absorbent is composed of a crystalline compound.

3. A light source device as set forth in claim 1, wherein the green phosphor contains at least one selected from the group consisting of a sulfide phosphor, an oxinitride phosphor, and an oxide phosphor.

4. A light source device as set forth in claim 1, wherein the red phosphor contains at least one selected from the group consisting of a fluoride phosphor, a nitride phosphor, an oxinitride phosphor, and a sulfide phosphor.

5. A light source device as set forth in claim 1,
wherein the green phosphor has an emission peak in a wavelength region of 520 nm to 550 nm.

6. A light source device as set forth in claim 1,
wherein the red phosphor has an emission peak in a wavelength region of 620 nm to 670 nm.

7. A light source device as set forth in claim 1,
wherein the absorbent contains a composition having the formula: $Nd_{1-x}R_xF_3$, wherein R is a rare earth element other than Nd, and wherein $0 \leq x < 1$.

8. A light source device as set forth in claim 1,
wherein, when an emission intensity at an emission peak of the blue light emitting element is taken as 1, an emission intensity at an emission peak of the green phosphor is 0.15 to 0.5 and an emission intensity at an emission peak of the red phosphor is 0.1 to 2.5.

9. A light source device, comprising:
(i) a blue light emitting element that emits blue light having an emission peak in a wavelength region of 440 nm to 460 nm;
(ii) a first light-transmissive member that encapsulates the blue light emitting element and contains:
  (a) a green phosphor that absorbs part of the blue light emitted by the blue light emitting element and thereby emits green light having an emission peak in a wavelength region of 500 nm to 575 nm; and
  (b) a red phosphor that absorbs at least one of part of the blue light emitted by the blue light emitting element and part of the green light emitted by the green phosphor, and thereby emits red light having an emission peak in a wavelength region of 600 nm to 690 nm; and
(iii) a second light-transmissive member that covers the first light-transmissive member and contains an absorbent containing neodymium fluoride that absorbs part of the green light and part of the red light.

10. A light source device as set forth in claim 9,
wherein the content ratio of the absorbent is 0.1 mass % to 15.0 mass % with respect to a total mass of the second light-transmissive member.

11. A light source device as set forth in claim 9,
wherein, when an emission intensity at an emission peak of the blue light emitting element is taken as 1, an emission intensity at an emission peak of the green phosphor is 0.15 to 0.5 and an emission intensity at an emission peak of the red phosphor is 0.1 to 2.5.

12. A light source device, comprising:
(i) a blue light emitting element that emits blue light having an emission peak in a wavelength region of 440 nm to 460 nm;
(ii) a green phosphor that absorbs part of the blue light emitted by the blue light emitting element and thereby emits green light having an emission peak in a wavelength region of 500 nm to 575 nm;
(iii) a red phosphor that absorbs at least one of part of the blue light emitted by the blue light emitting element and part of the green light emitted by the green phosphor, and thereby emits red light having an emission peak in a wavelength region of 600 nm to 690 nm; and
(iv) a light diffusion plate containing an absorbent containing neodymium fluoride that absorbs part of the green light and part of the red light and having: (a) a first principal surface into which a mixture of the blue light, the green light, and the red light enters; and (b) a second principal surface from which the mixture of the blue light, the green light, and the red light emerges.

13. A light source device as set forth in claim 12,
wherein the content ratio of the absorbent is 0.1 mass % to 15.0 mass % with respect to a total mass of the light diffusion plate.

14. A light source device as set forth in claim 12,
wherein, when an emission intensity at an emission peak of the blue light emitting element is taken as 1, an emission intensity at an emission peak of the green phosphor is 0.15 to 0.5 and an emission intensity at an emission peak of the red phosphor is 0.1 to 2.5.

15. A light source device, comprising:
(i) a blue light emitting element that emits blue light having an emission peak in a wavelength region of 440 nm to 460 nm;
(ii) a green phosphor that absorbs part of the blue light emitted by the blue light emitting element and thereby emits green light having an emission peak in a wavelength region of 500 nm to 575 nm;
(iii) a red phosphor that absorbs at least one of part of the blue light emitted by the blue light emitting element and part of the green light emitted by the green phosphor, and thereby emits red light having an emission peak in a wavelength region of 600 nm to 690 nm; and
(iv) a light guide plate containing an absorbent containing neodymium fluoride that absorbs part of the green light and part of the red light and having: (a) a side surface into which a mixture of the blue light, the green light, and the red light enters; and (b) at least one principal surface from which the mixture of the blue light, the green light, and the red light emerges.

16. A light source device as set forth in claim 15,
wherein the content ratio of the absorbent is 0.1 mass % to 15.0 mass % with respect to a total mass of the light guide plate.

17. A light source device as set forth in claim 15,
wherein, when an emission intensity at an emission peak of the blue light emitting element is taken as 1, an emission intensity at an emission peak of the green phosphor is 0.15 to 0.5 and an emission intensity at an emission peak of the red phosphor is 0.1 to 2.5.

* * * * *